United States Patent
Lee et al.

(10) Patent No.: US 8,383,013 B2
(45) Date of Patent: *Feb. 26, 2013

(54) PHOTOSENSITIVE PASTE COMPOSITION FOR FABRICATING THE PLASMA DISPLAY PANEL ELECTRODE, PLASMA DISPLAY PANEL ELECTRODE AND PLASMA DISPLAY PANEL THEREBY

(75) Inventors: Byung Chul Lee, Gyeonggi-do (KR); Hee In Nam, Gyeonggi-do (KR); Yong Hyun Kim, Gyeonggi-do (KR); Hyun Don Kim, Gyeonggi-do (KR)

(73) Assignee: Cheil Industries, Inc., Kyeongsangbuk-Do (KR)

( * ) Notice: Subject to any disclaimer, the term of this patent is extended or adjusted under 35 U.S.C. 154(b) by 600 days.

This patent is subject to a terminal disclaimer.

(21) Appl. No.: 12/451,790

(22) PCT Filed: May 16, 2008

(86) PCT No.: PCT/KR2008/002770
§ 371 (c)(1),
(2), (4) Date: Dec. 1, 2009

(87) PCT Pub. No.: WO2008/147063
PCT Pub. Date: Dec. 4, 2008

(65) Prior Publication Data
US 2010/0164357 A1  Jul. 1, 2010

(30) Foreign Application Priority Data

Jun. 1, 2007 (KR) .......................... 10-2007-0053742

(51) Int. Cl.
*H01B 1/22* (2006.01)
*H01L 31/0224* (2006.01)
*G03F 7/004* (2006.01)

(52) U.S. Cl. ........................................ 252/512; 136/252
(58) Field of Classification Search .......... 252/512–514; 136/252–256

See application file for complete search history.

(56) References Cited

U.S. PATENT DOCUMENTS
4,780,371 A * 10/1988 Joseph et al. ................. 428/414
(Continued)

FOREIGN PATENT DOCUMENTS
CN 1705044 A 12/2005
CN 1737684 A 2/2006
(Continued)

OTHER PUBLICATIONS

Office Action issued in corresponding Chinese application, 200880018132.X, dated Jun. 30, 2011.

*Primary Examiner* — Mark Kopec
(74) *Attorney, Agent, or Firm* — Lee & Morse, P.C.

(57) ABSTRACT

Disclosed herein is a photosensitive paste composition for a plasma display panel (PDP) electrode capable of minimizing edge curl, i.e., a phenomenon in which the edge of an electrode pattern portion is curled during baking and thus improving withstand voltage. The photosensitive paste composition comprises 40 to 55% by weight of a conductive powder, 5 to 15% by weight of an inorganic binder, 35 to 55% by weight of an organic vehicle, and the remaining percentage by weight of a solvent, wherein the inorganic binder is present in an amount of 15 to 35 parts by weight, with respect to 100 parts by weight of the conductive powder. Further disclosed are a plasma display panel (PDP) electrode fabricated using the composition, and a plasma display panel (PDP) comprising the electrode.

15 Claims, 2 Drawing Sheets

U.S. PATENT DOCUMENTS

| | | |
|---|---|---|
| 7,300,606 B2 | 11/2007 | Chung et al. |
| 7,582,229 B2 * | 9/2009 | Lee et al. ............... 252/512 |
| 7,582,404 B2 | 9/2009 | Lee et al. |
| 7,794,627 B2 * | 9/2010 | Park et al. ............... 252/500 |
| 2005/0287472 A1 | 12/2005 | Lee et al. |

FOREIGN PATENT DOCUMENTS

| | | |
|---|---|---|
| JP | 2007-086661 A | 4/2007 |
| KR | 10-2002-0088208 A | 11/2002 |
| KR | 10-2006-0029546 A | 4/2006 |

* cited by examiner

PHOTOSENSITIVE PASTE COMPOSITION FOR FABRICATING THE PLASMA DISPLAY PANEL ELECTRODE, PLASMA DISPLAY PANEL ELECTRODE AND PLASMA DISPLAY PANEL THEREBY

TECHNICAL FIELD

The present invention relates to a photosensitive paste composition, a plasma display panel electrode fabricated using the composition and a plasma display panel comprising the electrode. More specifically, the present invention relates to a photosensitive paste composition for a plasma display panel (PDP) electrode capable of minimizing edge curl, i.e., a phenomenon in which the edge of an electrode pattern portion is curled during baking and thus improving a withstand voltage property, a plasma display panel (PDP) electrode and a plasma display panel (PDP) comprising the electrode.

BACKGROUND ART

A recent increased demand for large-size, high-density, high-accuracy and high-reliability display devices has brought about the development of various pattern processing techniques. These various techniques are being used in fabricating plasma display panels (hereinafter, referred to as "PDPs").

In recent years, to manufacture high-accuracy electrode circuits suitable for large-size display devices, photolithography employing a photosensitive conductive paste was developed. Photolithography is a method for fabricating a patterned electrode, which comprises printing a photosensitive conductive paste over the entire surface of a glass substrate, drying the substrate, exposing the substrate to an ultraviolet exposure system equipped with a photomask, developing an uncured region of the substrate shielded by the photomask with a developing solution and baking the remaining cured film at a predetermined temperature.

Korean Patent Laid-open No. 10-2005-122498 suggests preparation of a photosensitive phase composition using a conductive powder, an inorganic binder and an organic vehicle.

As mentioned above, in conventional cases, in an attempt to improve important parameters of electrodes i.e., resistance, sanding resistance of terminals and withstand-voltage characteristics, a conductive powder and an inorganic binder were added to a photosensitive paste.

However, the conventional method suffers from the problem that electrode patterns are often abnormally formed according to a mix ratio of a conductive powder and an inorganic binder.

The reason for abnormal formation of the electrode patterns is as follows. First, after a developing process, the phenomenon in which electrode patterns have the shape of a reverse trapezoid, so-called "undercut" occurs.

As a result, during the final process, i.e., the baking process, the phenomenon in which electrode patterns are curled at edges thereof, referred to as "edge-curl," occurs.

The edge-curl phenomenon causes deterioration in withstand-voltage characteristics, resulting in deterioration in lifespan and luminescence efficiency of PDP products. In addition, terminal electrodes may be damaged by a sanding process, thus disadvantageously making it impossible for a PDP screen to normally display an image.

To solve this disadvantage, research has been made on methods for preventing the undercut phenomenon. The methods are based on improvement in exposure sensitivity and developing conditions, but fail to obtain satisfactory results.

In addition, Korean Patent Laid-open No. 10-2005-0116431 discloses a method for preventing the edge-curl phenomenon by minimizing a thickness contraction ratio of electrode patterns during baking. However, there is a limitation to prevention of the edge-curl phenomenon by controlling thicknesses of electrode patterns.

Technical Problem

It is one object of the present invention to provide a paste composition for a plasma display panel (PDP) electrode wherein edge curl, i.e., the phenomenon in which the edges of PDP electrodes are curled in the fabrication of the PDP electrodes using a paste composition, can be minimized and a withstand voltage property can thus be improved.

It is another object of the present invention to provide a PDP electrode fabricated using the paste composition and a PDP comprising the electrode.

Technical Solution

It is a technical characteristic of the present invention to fill the edges of electrodes with an inorganic binder to prevent edge curl of PDP electrodes.

In accordance with one aspect of the present invention, there is provided a photosensitive paste composition comprising: 40 to 55% by weight of a conductive powder; 5 to 15% by weight of an inorganic binder; 35 to 55% by weight of an organic vehicle; and the remaining percentage by weight of a solvent.

In accordance with another aspect of the present invention, there are provided an electrode fabricated using one method selected from screen printing, offset printing and photolithography, and a plasma display panel comprising the electrode.

Details of other aspects and exemplary embodiments of the present invention are encompassed in the following detailed description and the accompanying drawings.

The advantages, features and their achieving methods of the present invention will be more clearly understood from the following detailed description taken in conjunction with the accompanying drawings. Those skilled in the art will appreciate that various modifications, additions, and substitutions to the specific embodiments are possible, without departing from the scope and spirit of the invention as disclosed in the accompanying claims. These embodiments are given for the purpose of illustration and are not to be construed as limiting the scope of the invention. Throughout the disclosure of the present invention, the same or similar elements are denoted by the same reference numerals.

In exemplary embodiments, the paste composition for fabricating PDP electrodes comprises a conductive powder, an inorganic binder, an organic vehicle and a solvent.

The conductive powder that can be used in the present invention includes all of organic and inorganic materials that exhibit superior electrical conductivity.

Preferably, the conductive powder may be a metal powder and may be composed of one selected from gold, silver, copper, nickel, palladium, platinum, aluminum, an alloy thereof and a coating of two types thereof. Of these, the silver powder may be preferably used.

Preferably, the conductive powder may have spherical particles. This is the reason that the spherical particles exhibit superior filling ratio and ultraviolet transmission properties, as compared to flat or amorphous particles.

The conductive powder may preferably have a diameter (D50) of 0.1 to 2 μm, more preferably 0.5 to 1.8 μm.

The conductive powder may be preferably present in an amount of 40 to 55% by weight, more preferably 44 to 53% by weight, based on the total weight of the paste composition.

When the content of the conductive powder is less than 40% by weight, electrical conductivity is excessively low, thus disadvantageously making it difficult to conduct an electric current, and when the content of the conductive powder exceeds 55% by weight, the inorganic binder cannot sufficiently fill the edges of electrode patterns, thus disadvantageously causing severe edge curl.

The inorganic binder serves to promote sintering of the conductive powder and to impart adhesion force between the conductive powder and a glass substrate.

Preferably, the inorganic binder that can be used in the present invention is a metal oxide glass, including PbO, $Bi_2O_3$, $SiO_2$, $B_2O_3$, $P_2O_5$, ZnO, $Al_2O_3$, and the like. The type of the inorganic binder is not limited to leaded or unleaded compounds. The shape of the inorganic binder is preferably a spherical shape, but is not particularly limited thereto. Preferably, the inorganic binder has a diameter of 0.1 to 5 μm.

Preferably, the inorganic binder has a softening point of 400 to 600° C.

The inorganic binder is preferably present in an amount of 5 to 15% by weight with respect to the total weight of the paste composition. Preferably, the inorganic binder is present in an amount of 15 to 35 parts by weight, based on a total of 100 parts by weight of the conductive powder.

It is an essential characteristic of the present invention that is distinguished from the prior art to maximize the content of the inorganic binder, while satisfying the range of inherent minimum physical property values of electrodes.

The reason for the content of the inorganic binder is as follows. When the content is less than the range defined above, the inorganic binder cannot sufficiently fill the edges of electrode patterns, thus causing edge curl. In addition, when the content exceeds the range defined above, the electro-conductivity of electrodes may be deteriorated after baking. Accordingly, a primary goal of the present invention is to adjust the content range of the inorganic binder to a desired level.

The organic vehicle used herein serves to disperse the conductive powder and inorganic binder, bind them to each other, and then impart adhesion force between the paste composition and a glass substrate prior to baking after drying.

Examples of the organic vehicle that can be used in the present invention include: acrylic polymers prepared by copolymerizing acrylic monomers having a hydrophilic group e.g. carboxylic group; cellulose polymers such as ethyl cellulose, hydroxyethyl cellulose, hydroxypropyl cellulose or hydroxyethyl hydroxypropyl cellulose polymers; and combinations thereof. The organic vehicle may further comprise a cross-linking agent or a photoinitiator.

Any photoinitiator may be used in the present invention so long as it can exhibit superior optical reaction at an ultraviolet wavelength ranging from 200 to 400 nm. Generally, the photoinitiator may be selected from the group consisting of benzophenone, acetophenone and triazine compounds and combinations thereof.

The organic vehicle may be present in an amount of 35 to 55% by weight, based on the total weight of the paste composition.

When the content of the organic vehicle is less than 35% by weight, printability of the paste may be deteriorated, and when the content of the organic vehicle exceeds 55% by weight, straightness of patterns may be deteriorated during exposure and developing of the paste.

The solvent that can be used in the present invention is selected from those having a boiling point of 120° C. or higher, which are generally used in compositions for fabricating electrodes. Examples of solvents include methyl cellosolve, ethyl cellosolve, butyl cellosolve, aliphatic alcohol, α-terpineol, β-terpineol, dihydro-terpineol, ethylene glycol, ethylene glycol monobutyl ether, butyl cellosolve acetate, and texanol. The solvent may be used singly or in combination thereof.

If necessary, the composition may further comprise one or more additives selected from an ultraviolet stabilizer, an antifoaming agent, a dispersing agent, a leveling agent, an antioxidant and a thermal-polymerization inhibitor, to improve flow and process characteristics, and stability of the electrode composition. These additives are well-known such that they are readily purchased and used by those skilled in the art. Accordingly, specific examples of the additives and a detailed explanation thereof are omitted.

In accordance with another aspect of the present invention, there is provided a PDP electrode fabricated using the photosensitive paste composition as mentioned above.

The PDP electrode may be fabricated from the composition for fabricating electrodes using at least one method selected from screen printing, offset printing and photolithography.

Advantageous Effects

As apparent from the above description, according to the present invention, it is possible to structurally prevent edge curl by filling the edges of electrode patterns with an inorganic binder. That is, the present invention suggests the optimal content of an inorganic binder to improve withstand-voltage characteristics and sanding resistance, while preventing edge curl, thus providing a photosensitive paste composition capable of improving lifespan, luminescence efficiency and good quality rate of PDP products, a PDP electrode fabricated using the composition and a PDP comprising the electrode.

DESCRIPTION OF DRAWINGS

The above and other objects, features and other advantages of the present invention will be more clearly understood from the following detailed description taken in conjunction with the accompanying drawings, in which.

MODE FOR INVENTION

Hereinafter, a process for fabricating an electrode using screen printing will be illustrated in detail.

The electrode is fabricated by forming a micro-pattern, followed by baking.

The formation of the micro-pattern is carried out by printing a photosensitive paste composition thus prepared on the surface of a substrate using a screen printer provided with a screen mask such as a SUS 325 mesh or a SUS 400 mesh, drying the coated specimen in an IR drying furnace at a temperature of 80 to 150° C. for 5 to 30 minutes, exposing the paste coating film to a light source at a wavelength of 300 to 450 nm to form a pattern, and developing the pattern at about 30° C. with a suitable alkaline developing solution such as a $Na_2CO_3$ solution, a KOH solution or TMAH (tetramethylammonium hydroxide).

In addition, the baking is carried out in a furnace at 500 to 600° C. for 10 to 30 minutes.

The PDP electrode fabricated using the composition according to the present invention has a withstand voltage of 450 to 550V.

In another aspect, the present invention is directed to a PDP comprising a PDP electrode fabricated as mentioned above.

Figure 1:
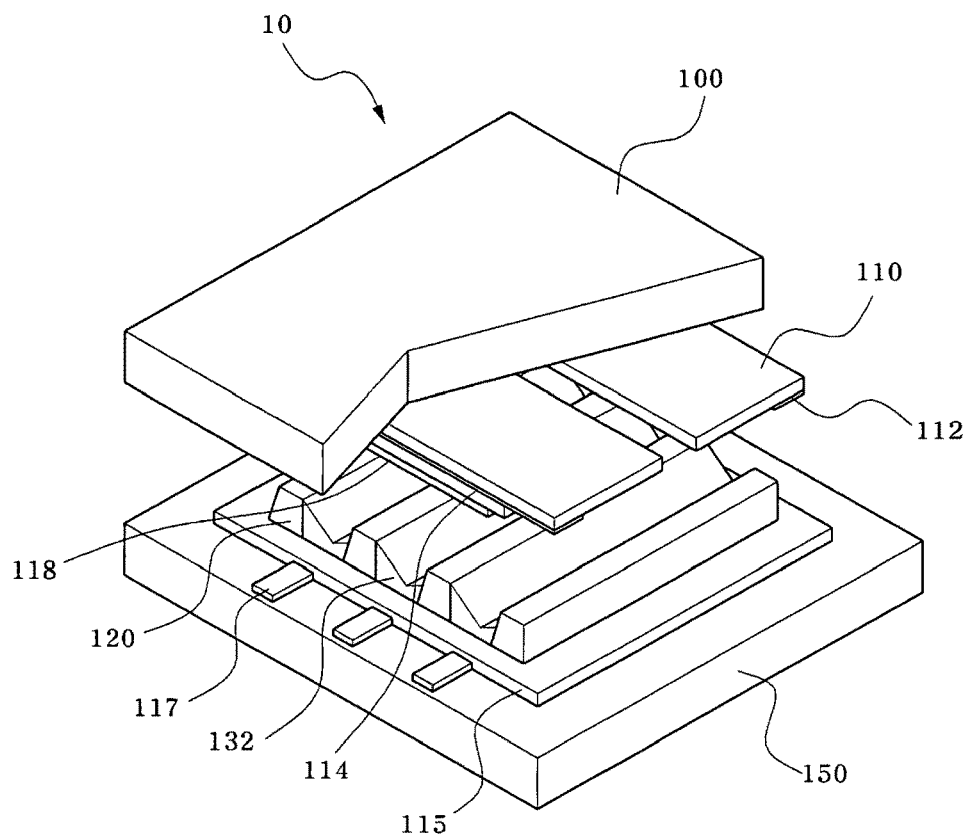
FIG. 1 is an exploded perspective view illustrating a plasma display panel fabricated from the composition according to an embodiment of the present invention.

FIG. 1 is an exploded perspective view illustrating a plasma display panel fabricated using the composition prepared in one embodiment according to the present invention.

The PDP electrode made of the composition of the present invention may be used in the fabrication of a white bus electrode 112 and an address electrode 117.

As shown in FIG. 1, a plasma display panel 10 fabricated using the composition according to one embodiment of the present invention includes a front substrate 100 and a rear substrate 150.

A transparent electrode 110 runs parallel to the front substrate 100 on the surface of the front substrate 100 facing the rear substrate 150. A bus electrode 112 is arranged on the transparent electrode 110. A first dielectric layer 114, to store an electric charge generated in the panel, is arranged on the transparent electrode 110. An MgO layer 118 is arranged on the transparent electrode 110, to protect the first dielectric layer 114 and promote emission of the electric charge.

A plurality of address electrodes 117 run vertical to the rear substrate 150 on the surface of the rear substrate 150 facing the front substrate 100.

A second dielectric layer 115 is arranged on the rear substrate 150 provided with the address electrodes 117. Barrier ribs 120 provided with respective RGB fluorescent substances 132 is arranged on the second dielectric layer 115 to define pixel regions.

An inert gas such as Ne+Ar or Ne+Xe is injected into the space between the front substrate 100 and the rear substrate 150, which discharges electricity to emit light, when a voltage above a critical voltage is applied to the electrode.

In the PDP structure, the bus electrode 112 and the address electrodes 117 are fabricated using the composition according to the present invention. More specifically, the fabrication is carried out using one selected from screen printing, offset printing and photolithography.

Hereinafter, the fact that the use of the paste composition for fabricating an electrode enables of minimization of the structural edge curl phenomenon, thus improving withstand voltage characteristics, and sanding resistance, and improving PDP product lifespan, luminescence efficiency and good quality rate will be illustrated with reference to the following specific Examples and Comparative Examples. Also, since contents which are not illustrated herein would be technically appreciated by those skilled in the art, a more specific description is omitted.

Example 1

50% by weight of a spherical silver powder as a conductive powder, 9% by weight of an amorphous $PbO$—$SiO_2$—$B_2O_3$-based binder with a softening point of 480° C. as an inorganic binder (the content of an inorganic binder corresponds to 18 parts by weight, with respect to 100 parts by weight of the conductive powder), and 40% by weight of an organic vehicle containing poly-MMA-MAA as a copolymer binder, dipentaerythritol diacrylate as a monomer, and 2-benzyl-2-diethylamino-1-(4-morpholinophenyl)-1-butanone as a photoinitiator were mixed, stirred in a stirrer and then kneaded using a 3-roll mill. Then, 1% by weight of texanol as a solvent was added to the reaction mixture for the purpose of controlling viscosity, to prepare a photosensitive paste composition.

Example 2

45% by weight of a spherical silver powder as a conductive powder, 11% by weight of an amorphous $PbO$—$SiO_2$—$B_2O_3$-based binder with a softening point of 480° C. as an inorganic binder (the content of an inorganic binder corresponds to 24.44 parts by weight, with respect to 100 parts by weight of the conductive powder), and 43% by weight of an organic vehicle containing poly-MMA-MAA as a copolymer binder, dipentaerythritol diacrylate as a monomer, and 2-benzyl-2-diethylamino-1-(4-morpholinophenyl)-1-butanone as a photoinitiator were mixed, stirred in a stirrer and then kneaded using a 3-roll mill. Then, 1% by weight of texanol as a solvent was added to the reaction mixture for the purpose of controlling viscosity, to prepare a photosensitive paste composition.

Comparative Example 1

65% by weight of a spherical silver powder as a conductive powder, 5% by weight of an amorphous $PbO$—$SiO_2$—$B_2O_3$-based binder with a softening point of 480° C. as an inorganic binder, and 29% by weight of an organic vehicle containing poly-MMA-MAA as a copolymer binder, dipentaerythritol diacrylate as a monomer, and 2-benzyl-2-diethylamino-1-(4-morpholinophenyl)-1-butanone as a photoinitiator were mixed, stirred in a stirrer and then kneaded using a 3-roll mill. Then, 1% by weight of texanol as a solvent was added to the reaction mixture for the purpose of controlling viscosity, to prepare a photosensitive paste composition.

<Performance Test>

PDP electrodes were fabricated with the compositions prepared in Example 1, Example 2 and Comparative Example 1 under the following process conditions and then evaluated for characteristics.

1) Printing: screen printing on a glass substrate with a size of 30 cm×30 cm

2) Drying: drying in an IR dry furnace at 120° C. for 10 minutes

3) Exposure: UV irradiation at an intensity of 400 mJ/cm² using a UV exposure system equipped with a high-pressure mercury lamp 4) Developing: spraying a 0.4% sodium carbonate aqueous solution at a nozzle pressure of 1.5 kgf/cm².

5) Baking: baking in an electric furnace at 560° C. for 20 minutes

6) Measurement of the baked film thickness: after baking, the film thickness was measured with film thickness measurement equipment.

7) Edge curl evaluation: Edge curl was evaluated by observing the cross-section of the baked film with a scanning electron microscope (SEM).

*edge curl (μm): edge curl height (μm)–baked film thickness (μm)

8) Formation of dielectric film: a dielectric was printed on the baked film, followed by drying and baking, to form a dielectric film.

9) Evaluation of withstand-voltage characteristics: withstand-voltage values are measured using a withstand voltage tester (Chroma Ate, Inc., AC/DC/IR Hipot Tester Model 19052).

Table 1 below shows performance evaluation results for the compositions prepared in Examples and Comparative Examples.

Figure 2:
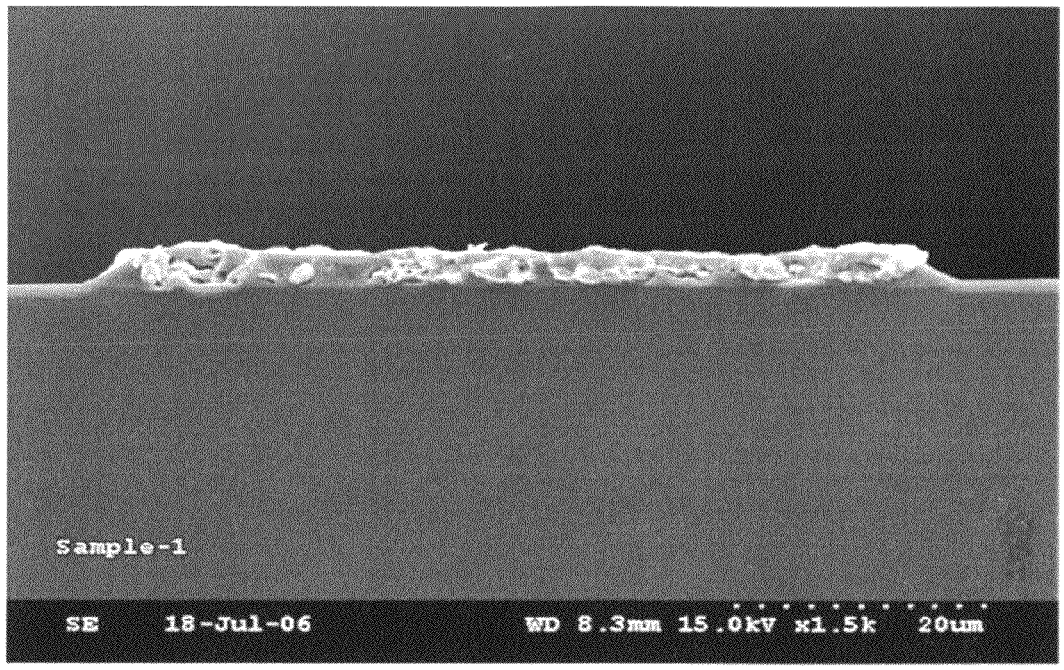
FIG. 2 is a cross-section SEM image of an electrode fabricated from the paste composition prepared in Example 1.

FIG. 2 is an SEM image of the electrode fabricated in Example 1.

Figure 3:
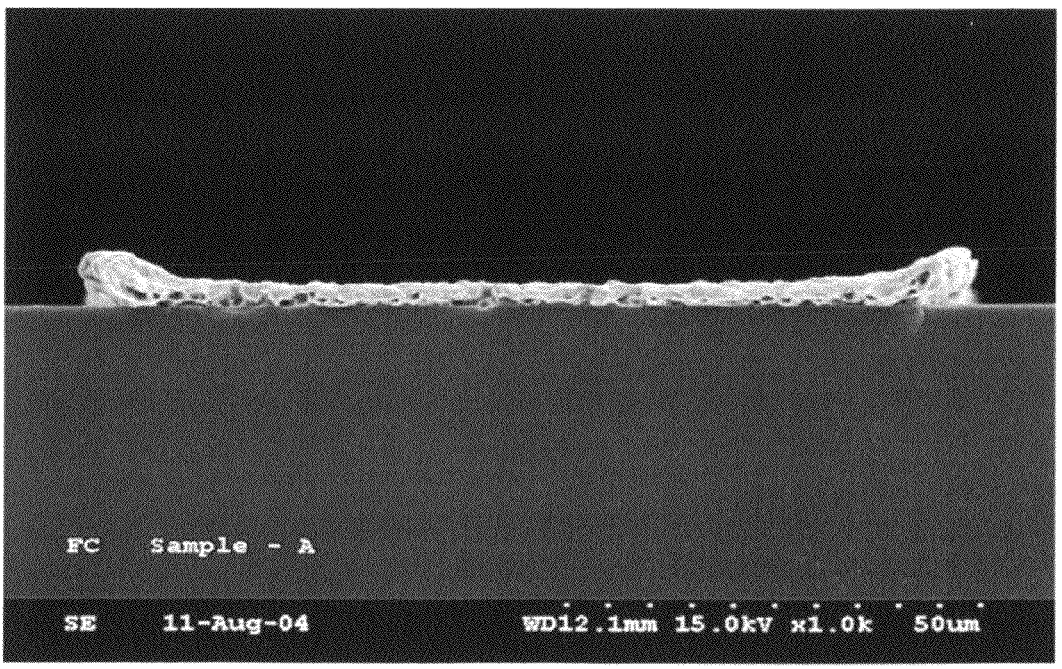
FIG. 3 is a cross-section SEM image of an electrode fabricated from the paste composition prepared in Comparative Example 1.

FIG. 3 is an SEM image of the electrode fabricated in Comparative Example 1.

TABLE 1

| Properties | Ex. 1 | Ex. 2 | Ex. 3 |
|---|---|---|---|
| Baked film thickness (μm) | 4.0 | 3.8 | 4.0 |
| Edge height (μm) | 4.0 | 3.8 | 8.5 |
| Edge curl (μm) | 0 | 9 | 4.5 |
| Withstand-voltage (V) | 470 | 510 | 395 |

As can be seen from the results shown in Table 1 and FIG. 2, the electrode fabricated in Example 1 showed no edge curl. Furthermore, it can be confirmed that the electrode exhibited superior withstand voltage characteristics, i.e., 470V.

Meanwhile, the electrode of Example 2 also showed no edge curl phenomenon and exhibited superior withstand voltage characteristics, i.e., 510V.

On the other hand, as can be seen from the SEM image of FIG. 3, the electrode of Comparative Example 1 showed severe edge curl and exhibited bad withstand voltage characteristics, i.e., 395V, as compared to the electrodes of the Examples.

The invention claimed is:

1. A photosensitive paste composition comprising:
   40 to 55% by weight of a conductive powder;
   5 to 15% by weight of an inorganic binder, the inorganic binder being present in an amount of 15 to 35 parts by weight with respect to 100 parts by weight of the conductive powder;
   35 to 55% by weight of an organic vehicle; and
   the remaining percentage by weight of a solvent.

2. The composition according to claim 1, wherein the conductive powder is composed of one selected from gold, silver, copper, nickel, palladium, platinum, aluminum, and an alloy thereof and a coating of two types thereof.

3. The composition according to claim 1, wherein the conductive powder has a spherical shape and a diameter (D50) of 0.1 to 2 μm.

4. The composition according to claim 1, wherein the inorganic binder is a metal oxide glass, including PbO, $Bi_2O_3$, $SiO_2$, $B_2O_3$, $P_2O_5$, ZnO or $Al_2O_3$.

5. The composition according to claim 1, wherein the inorganic binder has a diameter (D50) of 0.1 to 5 μm.

6. The composition according to claim 1, wherein the inorganic binder has a softening point of 400 to 600° C.

7. The composition according to claim 1, wherein the organic vehicle comprises at least one of an acrylic polymer prepared by copolymerizing acrylic monomers having a hydrophilic group and a cellulose polymer.

8. The composition according to claim 7, wherein the cellulose polymer is selected from ethyl cellulose, hydroxyethyl cellulose, hydroxypropyl cellulose, hydroxyethyl hydroxypropyl cellulose and a combination thereof.

9. The composition according to claim 1, wherein the organic vehicle further comprises at least one of a crosslinking agent and a photoinitiator.

10. The composition according to claim 1, wherein the solvent has a boiling point of 120° C. or higher.

11. The composition according to claim 1, wherein the solvent is selected from methyl cellosolve, ethyl cellosolve, butyl cellosolve, aliphatic alcohol, α-terpineol, β-terpineol, dihydro-terpineol, ethylene glycol, ethylene glycol monobutyl ether, butyl cellosolve acetate, texanol and combinations thereof.

12. The composition according to claim 1, further comprising at least one additive selected from an ultraviolet stabilizer, an anti-foaming agent, a dispersing agent, a leveling agent, an antioxidant and a thermal-polymerization inhibitor.

13. An electrode for a plasma display panel (PDP) fabricated from the paste composition according to any one of claims 1, 2, 3, 4, 5, 6, 7, 8, 9, 10, 11, or 12.

14. The electrode according to claim 13, wherein the electrode has a withstand voltage of 450 to 550V.

15. A plasma display panel comprising the electrode according to claim 13.

* * * * *